United States Patent
Chung

(10) Patent No.: US 8,184,083 B2
(45) Date of Patent: May 22, 2012

(54) SOURCE DRIVER IN LIQUID CRYSTAL DISPLAY DEVICE, OUTPUT BUFFER INCLUDED IN THE SOURCE DRIVER, AND METHOD OF OPERATING THE OUTPUT BUFFER

(75) Inventor: Kyu-young Chung, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1041 days.

(21) Appl. No.: 12/153,303

(22) Filed: May 16, 2008

(65) Prior Publication Data

US 2008/0290909 A1 Nov. 27, 2008

(30) Foreign Application Priority Data

May 25, 2007 (KR) .................. 10-2007-0051078

(51) Int. Cl.
*G09G 3/36* (2006.01)
*G09G 5/00* (2006.01)
*G06F 3/038* (2006.01)
*H03F 3/45* (2006.01)

(52) U.S. Cl. .......... 345/98; 345/211; 330/252; 330/261

(58) Field of Classification Search ............ 345/84–104, 345/204–215, 690–699; 330/253, 261, 252, 330/254
See application file for complete search history.

(56) References Cited

U.S. PATENT DOCUMENTS

| 5,907,262 A * | 5/1999 | Graeme et al. | 330/255 |
| 6,392,485 B1 * | 5/2002 | Doi et al. | 330/253 |
| 6,466,093 B1 * | 10/2002 | Yan | 330/253 |
| 7,551,030 B2 * | 6/2009 | An et al. | 330/255 |
| 2004/0041763 A1 | 3/2004 | Kodama et al. | |
| 2005/0088394 A1 | 4/2005 | Chung | |
| 2005/0128000 A1 * | 6/2005 | Parkhurst | 330/255 |
| 2006/0012433 A1 * | 1/2006 | Chung | 330/267 |
| 2008/0077347 A1 * | 3/2008 | Chung | 702/107 |

FOREIGN PATENT DOCUMENTS

| JP | 2006-163348 | 6/2006 |
| KR | 1020050040790 | 5/2005 |

* cited by examiner

*Primary Examiner* — Alexander Eisen
*Assistant Examiner* — Patrick F Marinelli
(74) *Attorney, Agent, or Firm* — Harness, Dickey & Pierce, PLC

(57) ABSTRACT

Provided is an output buffer, which may be included in a source driver of a liquid crystal display (LCD) device. The output buffer may include a differential amplification unit and an output unit. The differential amplification unit may generate control currents by amplifying the difference between the voltages of an analog image signal and a signal output from the output buffer. The output unit outputs the amplified analog image signal in response to the control currents. The amount of bias current used to drive the differential amplification unit increases during a charge recycling period, and the amount of quiescent current flowing through the output unit decreases during the charge recycling period. The amount of the bias current used to drive the differential amplification unit decreases during a driving period, and the amount of the quiescent current flowing through the output unit increases during the driving period.

28 Claims, 7 Drawing Sheets

SOURCE DRIVER IN LIQUID CRYSTAL DISPLAY DEVICE, OUTPUT BUFFER INCLUDED IN THE SOURCE DRIVER, AND METHOD OF OPERATING THE OUTPUT BUFFER

PRIORITY STATEMENT

This application claims the benefit of Korean Patent Application No. 10-2007-0051078, filed on May 25, 2007, in the Korean Intellectual Property Office, the disclosure of which is incorporated herein in its entirety by reference.

BACKGROUND

1. Field of the Invention

Example embodiments relate to a liquid crystal display (LCD) device, and more particularly, to a source driver included in a LCD device, an output buffer included in the source driver, and a method of operating the output buffer.

2. Description of the Related Art

Liquid crystal display (LCD) devices generally are smaller, thinner, and require less power than the other types of conventional display devices. Accordingly, LCD devices are applied to electronic apparatuses such as notebook computers and mobile phones, for example. In particular, active matrix type LCD devices that use thin film transistors (TFTs) as switch devices are suitable for moving image displays.

FIG. 1 is a block diagram of a conventional LCD device 100. Referring to FIG. 1, the LCD device 100 includes an LCD panel 110, a gate driver circuit 120, and a source driver circuit 200.

The gate driver circuit 120 generates a plurality of signals G1, G2, . . . , Gp for driving a plurality of gate lines GL arranged on the LCD panel 110. The source driver circuit 200 generates source line driving signals S1, S2, . . . , Sm for driving a plurality of source lines SL arranged on the LCD panel 110. The source lines are also referred to as data lines or channels.

The LCD panel 110 includes a plurality of pixels 111. Each of the pixels 111 includes a switch transistor TFT and a liquid crystal capacitor CLC. The switch transistor TFT is turned on or off in response to a signal that drives the gate line GL, and a source terminal of the switch transistor TFT is connected to the source line SL. The liquid crystal capacitor CLC is connected between a drain terminal of the switch transistor TFT and a source of common voltage VCOM. For example, the common voltage VCOM may transition from logic high to logic low (or from logic low to logic high) for every horizontal scan period.

FIG. 2 is a circuit diagram of the source driver circuit 200 illustrated in FIG. 1. Referring to FIG. 2, the conventional source driver circuit 200 includes a polarity inversion circuit 210, a latch circuit 220, a gray-scale voltage generator 230, a gamma decoder circuit 240, an output buffer circuit 250, a plurality of first switches 260, a plurality of second switches 270, an intermediate voltage generator 280, and a capacitor 290.

The polarity inversion circuit 210 includes a plurality of exclusive OR (XOR) gates. The polarity inversion circuit 210 receives a plurality of pieces of n-bit image data D1[n:1], D2[n:1], . . . , Dm[n:1]. The polarity inversion circuit 210 may or may not invert image data D1[n:1], D2[n:1], . . . , Dm[n:1], in response to a polarity control signal M.

The latch circuit 220 includes a plurality of D latches. The latch circuit 220 latches data received from the polarity inversion circuit 210 and outputs the latched data in response to a latch control signal S_LATCH.

The gray-scale voltage generator 230 generates $2^n$ analog gray-level voltages VG and applies them to the gamma decoder circuit 240.

The gamma decoder circuit 240 includes a plurality of gamma decoders. Each of the gamma decoders selects one of the $2^n$ analog gray-level voltages VG, which corresponds to an output digital value of the corresponding D latch included in the latch circuit 220, and then outputs the selected analog gray-level voltage VG.

The output buffer circuit 250 includes a plurality of output buffers 301, 302, . . . , 30$m$. Each of the output buffers 301, 302, . . . , 30$m$ uses a boosted voltage AVDD and ground voltage VSS for supply of power. The boosted voltage AVDD is generated using supply voltage VDD applied from the outside of the source driver circuit 200. The output buffers amplify analog image signals received from the gamma decoders and supply the amplified analog image signals A1, A2, . . . , Am to the first switches 260, respectively.

The first switches 260 respectively supply the amplified analog image signals A1, A2, . . . , Am as the source line driving signals S1, S2, . . . , Sm in response to an activated control signal GRAY_ON. The source line driving signals S1, S2, . . . , Sm are supplied to equivalent load capacitance Ceq connected to the source lines of the LCD device 100 illustrated in FIG. 1.

The intermediate voltage generator 280 receives an intermediate gray-level voltage VGC from among the $2^n$ analog gray-level voltages VG generated by the gray-scale voltage generator 230, and generates intermediate voltage VCI using the supply voltage VDD applied from the outside of the source driver circuit 200. The intermediate voltage VCI is applied to the second switches 270.

Each of the second switches 270 outputs the intermediate voltage VCI received from the intermediate voltage generator 280 as one of the source line driving signals S1, S2, . . . , Sm in response to an activated charge recycling signal CR_ON. The source line driving signals S1, S2, . . . , Sm precharge the source lines SL of the LCD device 100 to the intermediate voltage VCI.

The charge recycling signal CR_ON may be an inverted signal of the output control signal GRAY_ON. Since the charge recycling signal CR_ON is activated before the output control signal GRAY_ON is activated, the intermediate voltage VCI is applied to the source line SL before each of the amplified analog image signals A1, A2, . . . , Am is supplied to the corresponding equivalent load capacitance Ceq connected to the source line SL.

The capacitor 290 stabilizes the intermediate voltage VCI, thus reducing and/or preventing oscillation of the intermediate voltage VCI. Also, whenever the second switch 270 is activated (or is closed), the capacitor 290 may be supplied with electric charges stored in a source line SL having a voltage greater than the intermediate voltage VCI and supply the electric charges to a source line SL having a voltage less than the intermediate voltage.

The conventional source driver circuit 200 includes source drivers that generate the source line driving signals S1, S2, . . . , Sm. Each of the source drivers includes the XOR gate, the D latch, the gamma decoder, the output buffer, the first switch 260, and the second switch 270.

The digital image data D1[n:1], D2[n:1], . . . , Dm[n:1], the polarity control signal M, the latch control signal S_LATCH, the output control signals GRAY_ON, and the charge recycling signals CR_ON may be generated by a timing controller (not shown) included in the LCD 100. The timing controller controls the operation timing of the source driver circuit 200.

The second switches 270, the intermediate voltage generator 280, and the capacitor 290 control the source driver circuit 200 to perform a charge recycling operation. In the charge recycling operation, the voltage of a source line driving signal does not transition from a high voltage directly to a low voltage or from the low voltage directly to the high voltage. Instead, the voltage of the source line driving signal transitions from the high voltage to the intermediate voltage VCI and then to the low voltage. The intermediate voltage VCI is a voltage having a value between the high voltage and low voltage. Alternatively, the voltage of the source line driving signal transitions from the low voltage to the intermediate voltage and then to the high voltage. The charge recycling operation reduces the consumption of power in the output buffer circuit 250.

FIG. 3 is a timing diagram illustrating an operation of the conventional source driver illustrated in FIG. 2. The operation of the source driver will now be described with reference to FIGS. 2 and 3.

Referring to FIG. 3, a polarity control signal M is toggled in time duration units of horizontal scan periods HP.

A latch control signal S_LATCH that transitions to a high value during the horizontal scan period HP causes an amplified analog image signal Am to be generated by the output buffer 30m. The polarity of the amplified analog image signal Am may or may not be inverted based on the logic state of the inverted control signal M. The amplified analog image signal Am may be data that swings the full degree between a high voltage VH and a low voltage VL, such as black image data.

In a charge recycling period RP in which a charge recycling signal CR_ON is activated to logic high and thus the second switch 270 is short-circuited, an intermediate voltage VCI is applied to a source line connected to the second switch 270. Then, a source line driving signal Sm transitions from the high voltage to the intermediate voltage VCI or from the low voltage VL to the intermediate voltage VCI.

In a driving period DP in which an output control signal GRAY_ON is activated to logic high and thus the first switch 260 is short-circuited, the amplified analog image signal Am is applied to the source line connected to the first switch 260. Then, the source line driving signal Sm transitions from the intermediate voltage VCI to the low voltage VL (image data having a logic "low" level) or from the intermediate voltage VCI to the high voltage VH (image data having a logic "high" level).

FIG. 4 is a circuit diagram illustrating in greater detail the output buffer 30m illustrated in FIG. 2. Referring to FIG. 4, the output buffer 30m includes a first input stage 310, a second input stage 320, and an output stage 330.

The output buffer 30m is a differential amplifier having a voltage follower configuration in which an amplified analog image signal Am output from the output buffer 30m is fed back to the first input stage 310 as an inverted input signal which is one of input signals input to the first input stage 310.

A plurality of first bias current sources 311 drive the first input stage 310. A second bias current source 321 drives the second input stage 320, and a bias voltage 322 of the second input stage 320 controls quiescent current IB3 flowing through the output stage 330 to be generated. The quiescent current (direct current) IB3 is current in a steady state. The steady state refers to a state in which the voltage of an input signal IN supplied to the output buffer 30m is equal to the voltage of the amplified analog image signal Am fed back to the first input stage 310. The input signal IN supplied to the output buffer 30m is received from the gamma decoder of the gamma decoder circuit 240 illustrated in FIG. 2.

The slew rate SR of the amplified analog image signal Am output from the output buffer 30m satisfies the following:

$$SR \propto (IB1/CC) \qquad (1),$$

wherein IB1 denotes the amount of current of the first bias current source 311 included in the first input stage 310, and CC denotes the capacitance of a compensation capacitor 331 included in the output stage 330.

The phase margin of the amplified analog image signal Am may be determined by the poles P1 and P2 of the transfer functions expressed in following Equations (2) and (3):

$$P1 \propto CC \qquad (2)$$

$$P2 \propto (IB3/Ceq) \qquad (3)$$

Here, the greater the values of the poles P1 and P2, the greater the phase margin of the amplified analog image signal Am and the higher the stability of the amplified analog image signal Am.

Referring to FIG. 3, the amplified analog image signal Am must transition to the low voltage VL (or the high voltage VH) before the end of the charge recycling period RP, so that the source line driving signal Sm can rapidly transition to the low voltage VL (or the high voltage VH), whichever is a target voltage in the driving period DP. Thus, in the charge recycling period RP, the slew rate of the amplified analog image signal Am must be increased. If the capacitance CC of the compensation capacitor 331 expressed in Equation (1) decreases, the stability of the output buffer 30m also decreases as expressed in Equation (2), and therefore, the amount of the current IB1 in Equation (1) must be increased in order to increase the slew rate of the amplified analog image signal Am. Also, the slew rate of the amplified analog image signal Am may increase in proportion to the amount of current of the second bias current source 321 of the second input stage 320, and therefore, the amount of current IB2 of the second bias current source 321 must also be increased.

In the driving period DP, the equivalent load capacitance Ceq that has a comparatively large load is connected to an output of the output buffer 30m. Thus, if it is assumed that the capacitance CC of the compensation capacitor 331 is fixed in order to maintain the sufficient phase margin of the amplified analog image signal Am, the amount of the quiescent current IB3 expressed in Equation (3) must be increased.

As described above, the amount of the driving currents IB1, IB2, and IB3 flowing through the output buffer 30m increases so that the output buffer 30m can normally operate in the charge recycling period RP and the driving period DP. Therefore, a conventional output buffer 30m may lead to comparatively large power consumption.

SUMMARY

Example embodiments provide a source driver in a liquid crystal display (LCD) device, which is capable of reducing power consumption, an output buffer included in the source driver, and a method of operating the output buffer.

An example embodiment provides an output buffer included in a source driver of an LCD (liquid crystal display) device. The output buffer may include a differential amplification unit generating control currents by amplifying the difference between voltages of an analog image signal and a signal output from the output buffer, and an output unit outputting a signal obtained by amplifying the analog image signal in response to the control currents. The amount of a bias current for driving the differential amplification unit increases and the amount of a quiescent current flowing through the output unit decreases during a charge recycling period in which a source line of the LCD device is precharged to a precharge voltage. The amount of the bias current for driving the differential amplification unit decreases and the amount of the quiescent current flowing through the output unit increases during a driving period in which the amplified analog image signal is supplied to the source line after the source line is precharged.

According to an example embodiment, the differential amplification unit may be a folded cascade operational transconductance amplifier, and the precharge voltage may be half a maximum gray-level voltage of the analog image signal.

Another example embodiment provides an output buffer included in a source driver of an LCD (liquid crystal display) device. The output buffer may include a differential input unit generating first control currents by amplifying the difference between voltages of an analog image signal and a signal output from the output buffer, a gain unit generating second control currents by adding the first control currents together, and an output unit outputting a signal obtained by amplifying the analog image signal in response to the second control currents. The amounts of bias currents that respectively drive the differential input unit and the gain unit increase and the amount of a quiescent current flowing through the output unit decreases during a charge recycling period in which a source line of the LCD device is precharged to a precharge voltage. The amounts of the bias currents that respectively drive the differential input unit and the gain unit decrease and the amount of the quiescent current flowing through the output unit increases during a driving period in which the amplified analog image signal is supplied to the source line after the source line is precharged.

According to an example embodiment, the differential input unit may include a first bias current source connected to a source of first voltage and providing bias current in the differential input unit during the charge recycling period, a second bias current source connected to a source of second voltage and providing the bias current in the differential input unit during the charge recycling period, a third bias current source connected to the source of first voltage and providing the bias current in the differential input unit during the driving period, and a fourth current source connected to the source of second voltage and providing the bias current in the differential input unit during the driving period. The amount of currents in the first and second bias current sources is greater than the amount of currents in the third and fourth bias current sources.

According to an example embodiment, the differential input unit may further include first and second input transistors receiving the analog image signal and the signal output from the output buffer, and generating the first control currents; a first switch one of connecting the first input transistors to the first bias current source in response to a charge recycling signal indicating the charge recycling period and disconnecting the first input transistors from the first bias current source in response to the charge recycling signal; a second switch one of connecting the second input transistors to the second bias current source in response to the charge recycling signal and disconnecting the second input transistors from the second bias current source in response to the charge recycling signal; a third switch one of connecting the first input transistors to the third bias current source in response to a driving signal indicating the driving period and disconnecting the first input transistors from the third bias current source in response to a driving signal indicating the driving period; and a fourth switch one of connecting the second input transistors to the fourth bias current source in response to the driving signal and disconnecting the second input transistors from the fourth bias current source in response to the driving signal. The driving signal may be an inverted signal of the charge recycling signal.

According to an example embodiment, the gain unit may include a first floating current source providing bias current in the gain unit during the charge recycling period; a second floating current source providing the bias current in the gain unit during the driving period; a first floating voltage source controlling quiescent current to be generated in the output unit during the charge recycling period; and a second floating voltage source controlling quiescent current to be generated in the output unit during the driving period. The amount of current in the first floating current source is greater than the amount of current in the second floating current source, and a voltage of the first floating voltage source is greater than a voltage of the second floating voltage source.

According to an example embodiment, the gain unit may further include a first current mirror circuit receiving a first differential current signal from among the first control currents, the first current mirror circuit being connected to a source of first voltage; a second current mirror circuit receiving a second differential current signal from among the first control currents, the second current mirror circuit being connected to a source of second voltage; a first switch connecting the first current mirror circuit to the second current mirror circuit in response to a charge recycling signal indicating a charge recycling period or disconnecting the first current mirror circuit from the second current mirror circuit in response to the charge recycling signal; a second switch connecting the first current mirror circuit to the second current mirror circuit in response to a driving signal indicating a driving period or disconnecting the first current mirror circuit from the second current mirror circuit in response to the driving signal; a third switch connecting the first current mirror circuit to the second current mirror circuit in response to the charge recycling signal or disconnecting the first current mirror circuit from the second current mirror circuit in response to the charge recycling signal; and a fourth switch connecting the first current mirror circuit to the second current mirror circuit in response to the driving signal or disconnecting the first current mirror circuit from the second current mirror circuit in response to the driving signal. The first floating current source is connected between the first switch and the second current mirror circuit; the second floating current source is connected between the second switch and the second current mirror circuit; the first floating voltage source is connected between the third switch and the second current mirror circuit; and the second floating voltage source is connect between the fourth switch and the second current mirror circuit. The first current mirror circuit and the second current mirror circuit form a current summing circuit, and generate second control currents for driving the output unit. The first current mirror circuit and the second current mirror circuit may form a current summing circuit, and generate second control currents for driving the output unit.

Another example embodiment provides an output buffer included in a source driver of an LCD (liquid crystal display) device. The output buffer may include a differential input unit generating first control currents by amplifying the difference between voltages of an analog image signal and a signal output from the output buffer; a gain unit generating second control currents by adding the first control currents together; and an output unit outputting a signal obtained by amplifying the analog image signal in response to the second control currents. The differential input unit includes first and second bias current sources having a first amount of current during a charge recycling period in which a source line of the LCD device is precharged to a precharge voltage; and third and fourth bias current sources having a second amount of current during a driving period in which the amplified analog image signal is supplied to the source line after the source line is precharged. The second amount of current is less than the first amount of current. The gain unit includes a first floating current source which drives the gain unit and has a third amount of current during the charge recycling period; a second floating current source which drives the gain unit and has a fourth amount of current during the driving period, the fourth amount of current is less than the third amount of current; a first floating voltage source that controls first quiescent current to be generated in the output unit and has a first voltage during the charge recycling period; and a second floating voltage source which controls second quiescent current to be generated in the output unit and has a second voltage during the driving period, where the second voltage is less than the first voltage. The amount of the first quiescent current is less than the amount of the second quiescent current.

Another example embodiment provides a method of operating an output buffer included in a source driver of an LCD (liquid crystal display) device. The method may include generating control currents by amplifying the difference between voltages of an analog image signal and the output buffer; outputting a signal obtained by amplifying the analog image signal in response to the control currents; increasing the amount of bias current for driving a differential amplification unit included in the output buffer and reducing the amount of quiescent current flowing through an output unit included in the output buffer during a charge recycling period in which a source line of the LCD device is precharged to a precharge voltage; and reducing the amount of the bias current for driving the differential amplification unit and increasing the amount of the quiescent current flowing through the output unit during a driving period in which the amplified analog image signal is supplied to the source line after the source line is precharged.

Still another example embodiment provides a method of operating an output buffer included in a source driver of an LCD (liquid crystal display) device. The method may include generating first control currents by amplifying the difference between voltages of an analog image signal and a signal output from the output buffer; generating second control currents by adding the first control currents together; outputting a signal obtained by amplifying the analog image signal in response to the second control currents; increasing the amount of bias currents that respectively drive a differential input unit and a gain unit included in the output buffer and reducing the amount of quiescent current flowing through an output unit included in the output buffer during a charge recycling period in which a source line of the LCD device is precharged to a precharge voltage; and reducing the amount of the bias currents that respectively drive the differential input unit and the gain unit and increasing the amount of the quiescent current flowing through the output unit during a driving period in which the amplified analog image signal is supplied to the source line after the source line is precharged.

Another example embodiment provides a source driver of an LCD (liquid crystal display) device. The source driver may include a gamma decoder transforming a digital image signal into an analog image signal and outputting the analog image signal; and an output unit amplifying and outputting the analog image signal. The amount of bias current for driving a differential amplification unit included in the output buffer increases and the amount of quiescent current flowing through an output unit included in the output buffer decreases during a charge recycling period in which a source line of the LCD device is precharged to a precharge voltage, and the amount of the bias current for driving the differential amplification unit decreases and the amount of the quiescent current flowing through the output unit increases during a driving period in which the amplified analog image signal is supplied to the source line after the source line is precharged.

BRIEF DESCRIPTION OF THE DRAWINGS

The above and other features and advantages of example embodiments of the present application will become more apparent by describing, in detail, example embodiments with reference to the attached drawings in which.

DETAILED DESCRIPTION OF EXAMPLE EMBODIMENTS

Figure 1:
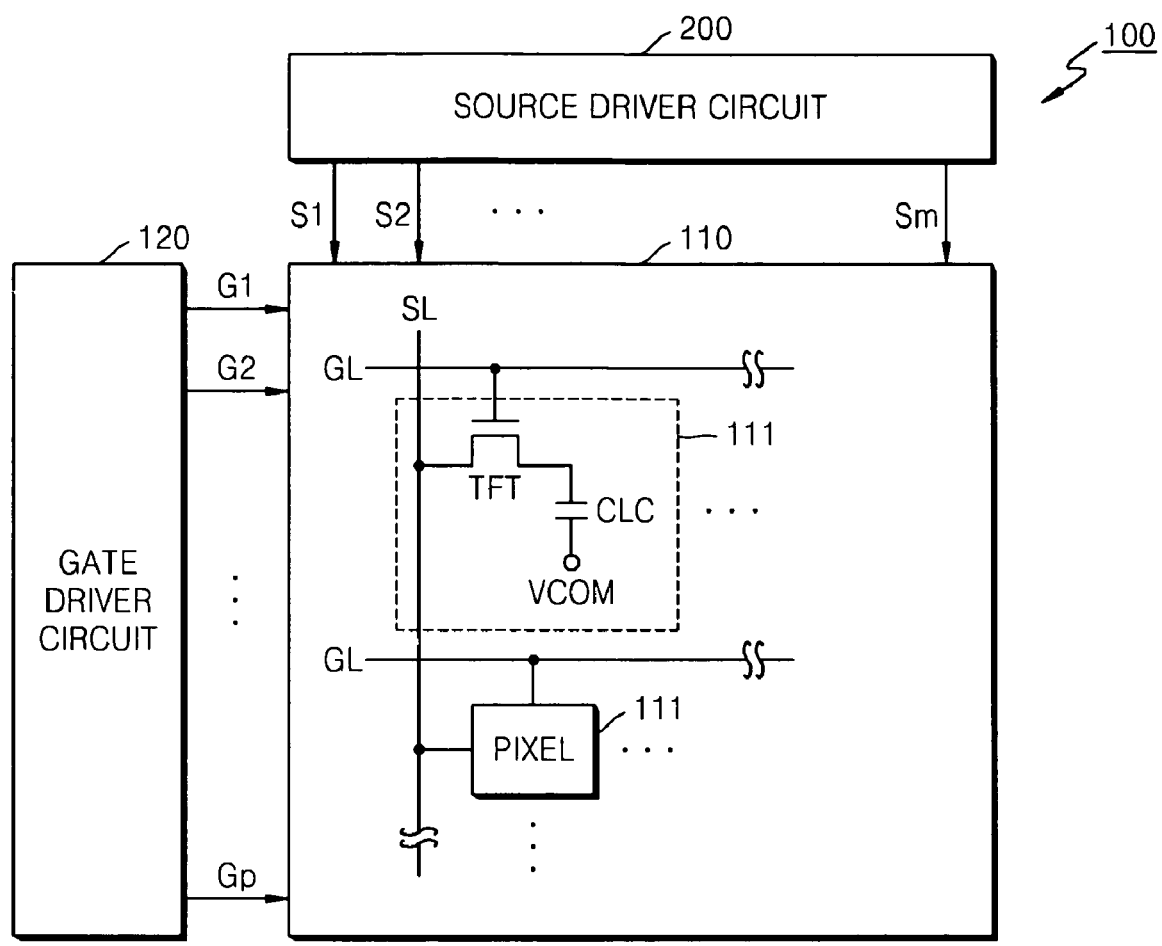
FIG. 1 is a block diagram of a conventional liquid crystal display (LCD) device.
Figure 2:
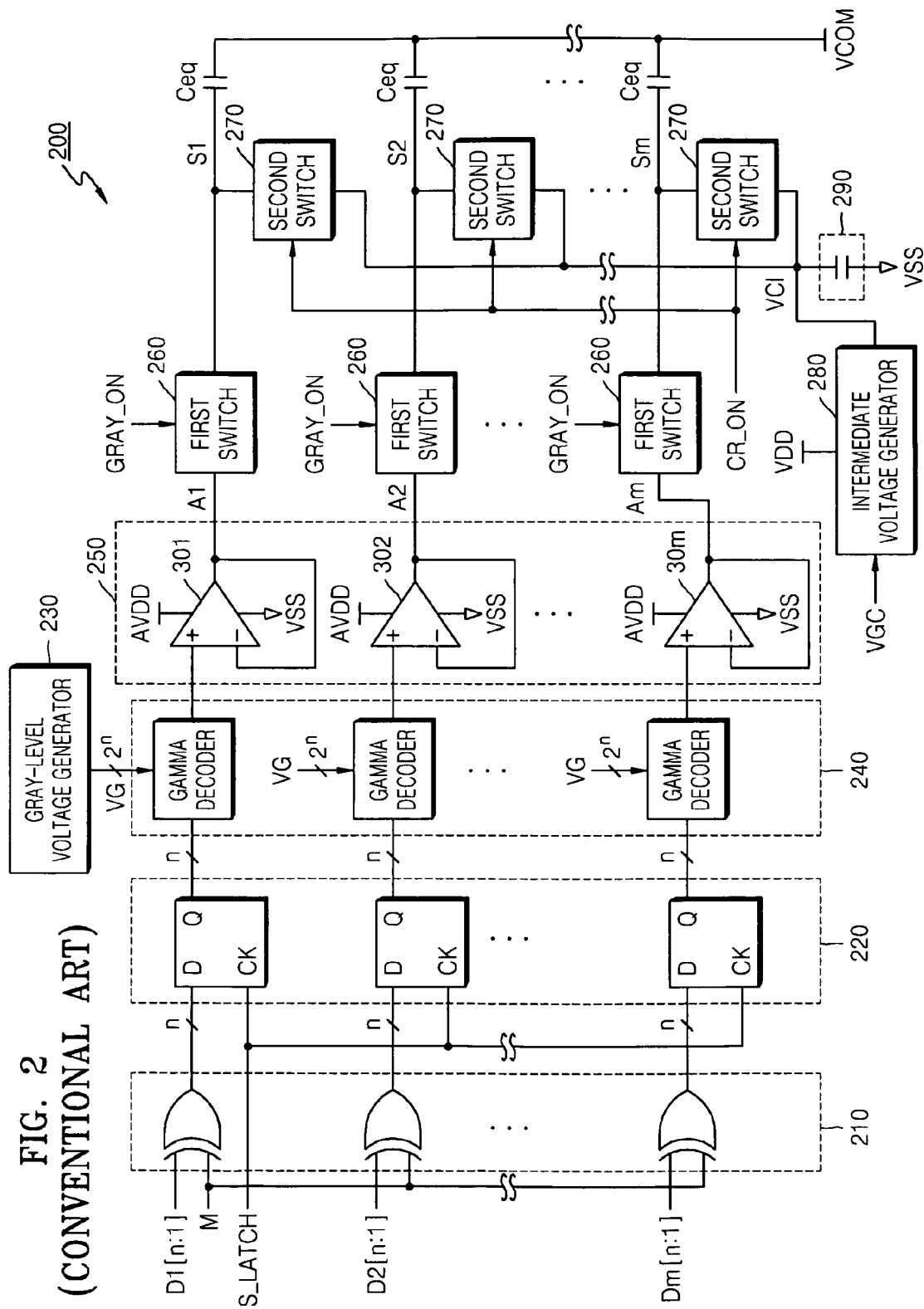
FIG. 2 is a circuit diagram of a source driver circuit illustrated in FIG. 1.

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the example embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough, complete and fully convey the concept of example embodiments to those skilled in the art. In the drawings, like numbers refer to like elements throughout.

Figure 5:
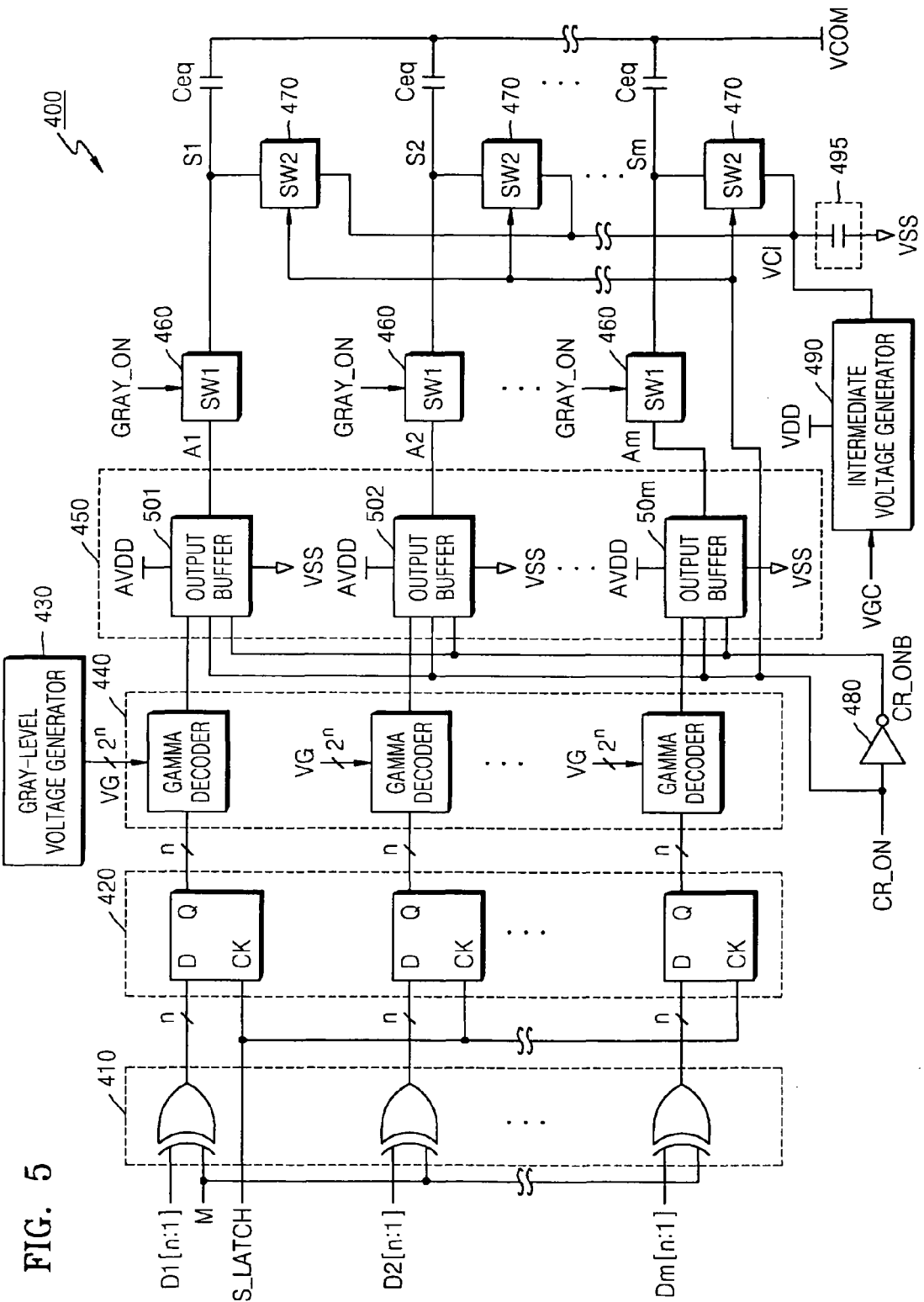
FIG. 5 is a circuit diagram of a source driver circuit according to an embodiment of the present application.

FIG. 5 is a circuit diagram of a source driver circuit 400 according to an embodiment of the present application.

Referring to FIG. 5, the source driver circuit 400 may include a polarity inversion circuit 410, a latch circuit 420, a gray-scale voltage generator 430, a gamma decoder circuit 440, an output buffer circuit 450, a plurality of first switches 460, a plurality of second switches 470, an inverter 480, an intermediate voltage generator 490, and a capacitor 495.

A polarity inversion circuit 410 may include a plurality of XOR gates, for example. In FIG. 5, the polarity inversion circuit 410 receives a plurality of pieces of n-bit image data D1[n:1], D2[n:1], ..., Dm[n:1]. The polarity inversion circuit 410 may or may not invert n-bit image data D1[n:1], D2[n:1], ..., Dm[n:1] in response to an inverted control signal M.

A latch circuit 420 may include a plurality of latches, such as the D latches shown in FIG. 5, for example. The latch circuit 420 may latch data received from the polarity inversion circuit 410 and output the latched data in response to latch control signal S_LATCH, for example.

A gray-scale voltage generator 430 may generate $2^n$ analog gray-level voltages VG and output them to the gamma decoder circuit 440.

A gamma decoder circuit 440 may include a plurality of gamma decoders. Each of the gamma decoders selects one of $2^n$ analog gray-level voltages VG, which corresponds to an output digital value of the corresponding D latch included in the latch circuit 420, and then outputs the selected analog gray-level voltage VG. That is, each gamma decoder transforms a digital image signal into an analog image signal and outputs the analog image signal.

Still referring to FIG. 5, an output buffer circuit 450 may include a plurality of output buffers 501, 502, ..., 50m. In FIG. 5, each of the output buffers 501, 502, ..., 50m uses a boosted voltage AVDD and a ground voltage VSS as a power source. The boosted voltage AVDD may be generated from a supply voltage VDD applied from the outside of the source driver circuit 400. Each of the output buffers 501, 502, ..., 50m amplifies an analog image signal received from the corresponding gamma decoder and then transmits one of the amplified analog image signals A1, A2, ..., Am to the corresponding first switch 460.

According to an example embodiment, each of the output buffers 501, 502, ..., 50m operates in response to a charge recycling signal CR_ON and an inverted signal CR_ONB of the charge recycling signal CR_ON. The inverted signal CR_ONB of the charge recycling signal CR_ON is generated by the inverter 480 in the example embodiment of FIG. 5. The construction and operation of an output buffer, e.g., the output buffer 50m, which may reduce the consumption of power (or current), will be described in greater detail later with reference to FIG. 6.

A first switch 460 may output the received amplified analog image signal as one of source line driving signals S1, S2, ..., Sm in response to an activated output control signal GRAY_ON. The source line driving signal may be supplied to an equivalent load capacitance Ceq connected to a source line of a liquid crystal display (LCD) device (not shown). The output control signal GRAY_ON may be the same as the inverted signal CR_ONB of the charge recycling signal CR_ON.

An intermediate voltage generator 490 may receive an intermediate gray-level voltage VGC of the $2^n$ analog gray-level voltages VG from the gray-scale voltage generator 430, and generates the intermediate voltage VCI from the supply voltage VDD, which may be applied from the outside of the source driver circuit 400. An intermediate voltage VCI equal to half the maximum gray-level voltage of the analog image signal is applied to the second switches 470 according to an example embodiment.

A second switch 470 may output the intermediate voltage VCI received from the intermediate voltage generator 490 as one of the source line driving signals S1, S2, ..., Sm in response to the activated charge recycling signal CR_ON. The source line driving signal precharges the source line of the LCD device to the intermediate voltage VCI. The charge recycling signal CR_ON is activated before the output control signal GRAY_ON is activated, and thus, the intermediate voltage VCI is applied to the source line before the amplified analog image signal is supplied to the equivalent load capacitance Ceq connected to the source line.

In an example embodiment, the source line is precharged to the intermediate voltage VCI by using the intermediate voltage generator 490. However, in another example embodiment, a voltage less than the intermediate voltage VCI and greater than a ground voltage VSS may be used as a precharge voltage of the source line, using one of the $2^n$ analog gray-level voltages VG generated by the gray-scale voltage generator 430, for example.

A capacitor 495 stabilizes the intermediate voltage VCI, thus reducing and/or preventing oscillation of the intermediate voltage VCI. Also, if the second switch 470 is activated or short-circuited, the capacitor 495 may be supplied with electric charges of a source line having a voltage greater than the intermediate voltage VCI and then supply the electric charges to a source line having a voltage less than the intermediate voltage VCI.

A source driver circuit 400 includes source drivers that generate the source line driving signals S1, S2, ..., Sm. Each of the source drivers may include an XOR gate, a D latch, a gamma decoder, an output buffer, a first switch 460, and a second switch 470.

A digital image data D1[n:1], D2[n:1], ..., Dm[n:1], polarity control signal M, latch control signal S_LATCH, output control signal GRAY_ON, and charge recycling signal CR_ON may be generated by a timing controller included in the LCD device. The timing controller controls the operation timing of the source driver circuit 400.

Second switches 470, an intermediate voltage generator 490, and a capacitor 495 control the source driver circuit 400 to perform a charge recycling operation. During the charge recycling operation, the source line driving signal does not transition from a high voltage directly to a low voltage, and or from the low voltage directly to the high voltage. Instead, the voltage of the source line driving signal transitions from the high voltage to an intermediate voltage and then from the intermediate voltage to the low voltage. The intermediate voltage is a voltage with a value between the low voltage and high voltage. Alternatively, the value of the source line driving signal transitions from the low voltage to the intermediate voltage and then from the intermediate voltage to the high voltage. The charge recycling operation reduces the consumption of power in the output buffer circuit 450.

Figure 3:
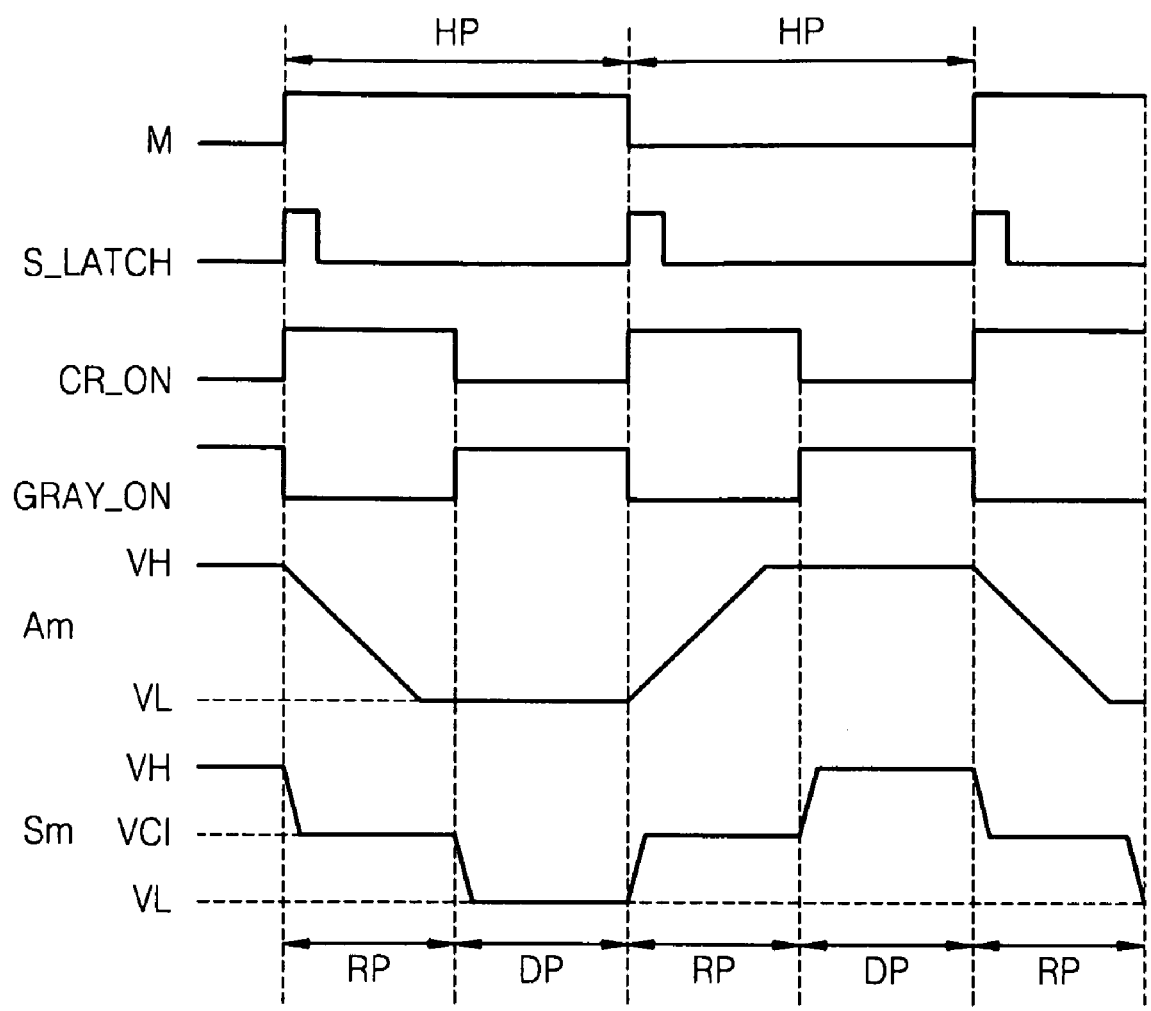
FIG. 3 is a timing diagram illustrating an example of the operation of a source driver illustrated in FIG. 2.

In one example embodiment, the operation of the source driver may be similar to that of the source driver illustrated in FIG. 3. For example, the source driver operates in time duration units of a charge recycling period RP and a driving period DP. An example construction and operation of an example embodiment of an output buffer 50m will be described with reference to FIGS. 3 and 5.

During a charge recycling period RP in which the charge recycling signal CR_ON is activated to logic high and thus the second switch 470 is short-circuited (the output control signal GRAY_ON is deactivated to logic low and thus the first switch 460 is opened), a slew rate of an amplified analog image signal Am must be increased as previously described with reference to FIG. 3. Also, during the charge recycling period RP, the output buffer 50m has a comparatively low parasitic load since the output of the output buffer 50m is not supplied to the equivalent load capacitance Ceq. The charge recycling period RP is a period where each source line of the LCD device is precharged to a precharge voltage.

During a driving period DP in which the output control signal GRAY_ON (or the inverted signal CR_ONB of the charge recycling signal CR_ON) is activated to logic high and the first switch 460 is short-circuited, the voltage of the amplified analog image signal Am has already been maintained at a target voltage and thus, the slew rate of the amplified analog image signal Am need not be increased. Also, during the driving period DP, the output buffer 50m has a comparatively high load since the output of the output buffer 50m is supplied to the equivalent load capacitance Ceq. The driving period DP is a period in which the source line is precharged and then the amplified analog image signal Am is supplied to the source line.

Figure 4:
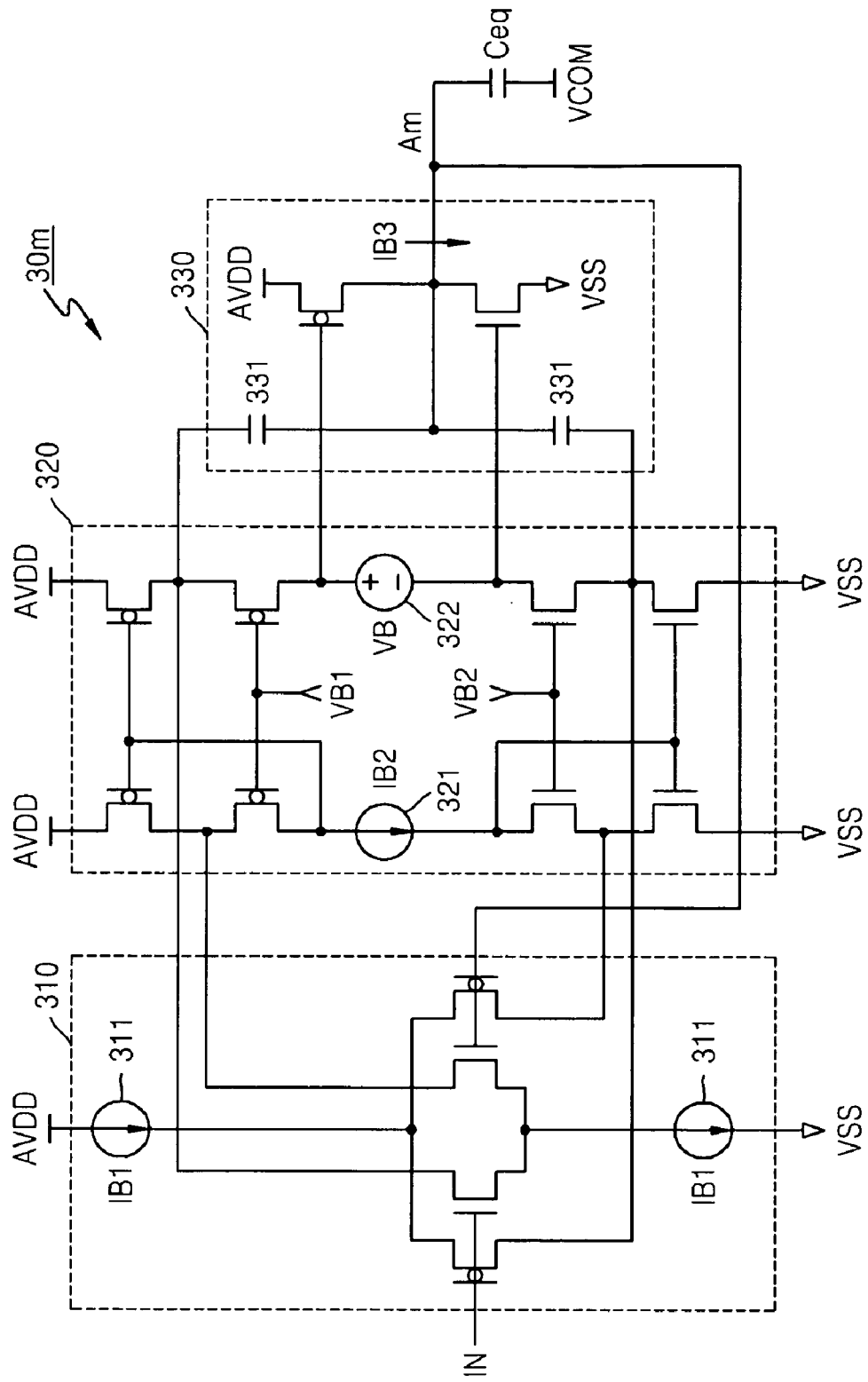
FIG. 4 is a circuit diagram illustrating in greater detail an output buffer illustrated in FIG. 2.

In order to satisfy the above slew rate condition during the charge recycling period RP and the driving period DP, the amount of bias current for driving a differential amplification unit (input stage) included in the output buffer 50m increases during the charge recycling period RP but decreases during the driving period DP. The amount of current in the differential amplification unit may correspond to the amount of current IB1 expressed in Equation (1) and the amount of current IB2 of the second input stage 320 illustrated in FIG. 4.

Also, in order to maintain sufficient phase margin of the amplified analog image signal Am according to the load condition during the charge recycling period RP and the driving period DP, the amount of quiescent current flowing through an output unit (output stage) included in the output buffer 50m decreases during the charge recycling period RP and increases during the driving period DP. The amount of the quiescent current flowing through the output unit may correspond to the quiescent current IB3 expressed in Equation (3).

In summary, during the charge recycling period RP, the amount of bias current for driving the differential amplification unit of the output buffer 50m increases and the amount of quiescent current flowing through the output unit of the output buffer 50m decreases. Further, during the driving period DP, the amount of bias current for driving the differential amplification unit of the output buffer 50m decreases and the amount of quiescent current flowing through the output unit of the output buffer 50m increases.

Thus, according to an example embodiment, the output buffer 50m is capable of separately controlling the amount of the bias current (operating current) in the output buffer 50m both during the charge recycling period RP and the driving period DP. As a result, the amount of current consumed in an example embodiment of an output buffer 50m may be significantly less than the amount of current in the conventional output buffer 30m of FIG. 4, which increases during both the charge recycling period RP and the driving period DP.

As described above, the output buffer 50m may be controlled by the charge recycling signal CR_ON used in source driver circuit 400. A source driver according to an example embodiment of the present application does not require an additional control signal in order to control the output buffer 50m.

Figure 6:
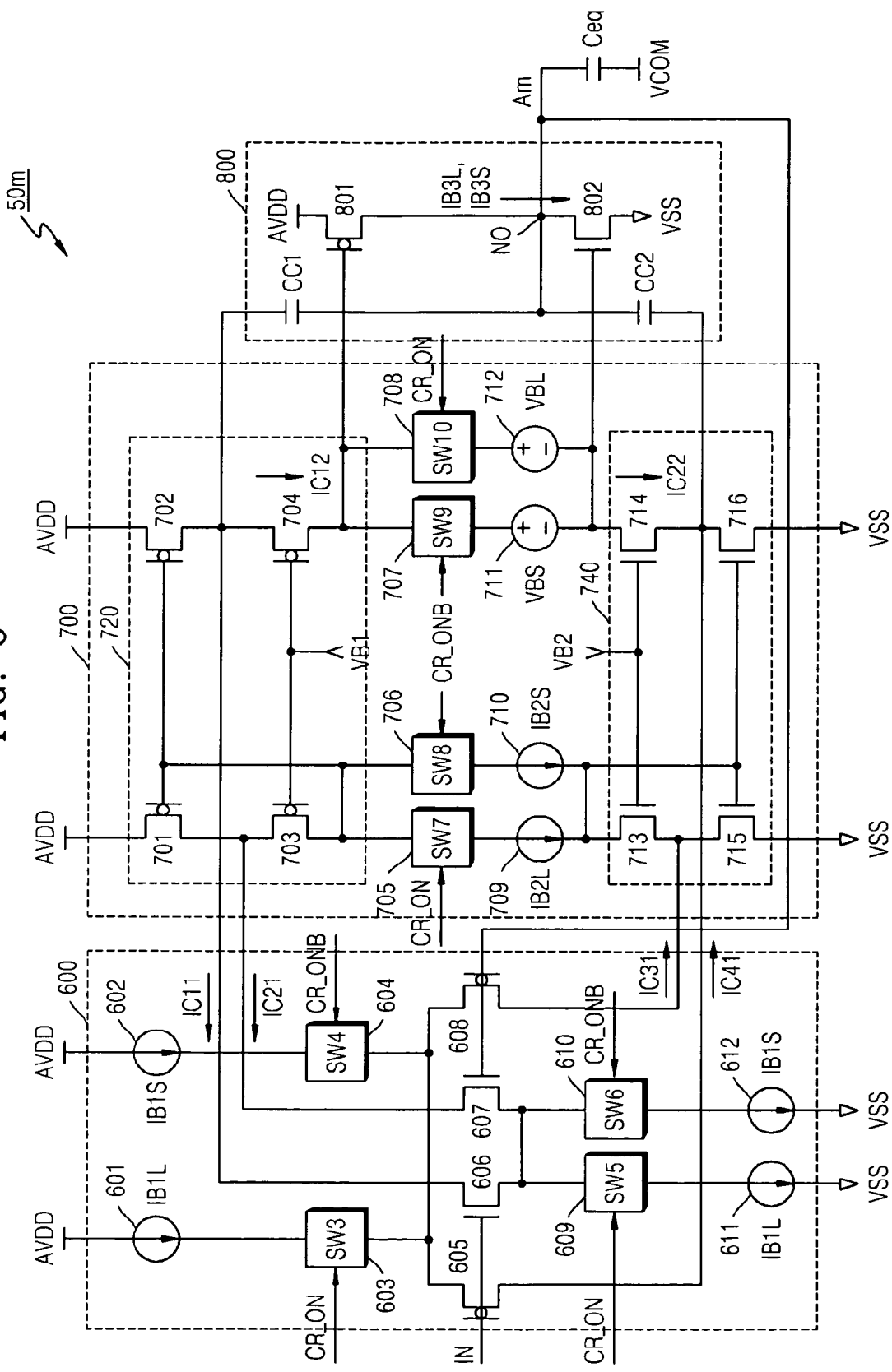
FIG. 6 is a circuit diagram of an example embodiment of an output buffer illustrated in FIG. 5.

FIG. 6 is a circuit diagram illustrating in greater detail the output buffer 50m illustrated in FIG. 5 according to an embodiment of the present application. Referring to FIG. 6, the output buffer 50m includes a differential input unit 600, a gain unit 700, and an output unit 800.

The output buffer 50m may be a differential amplifier having a voltage follower structure in which the amplified analog image signal Am output from the output buffer 50m is fed back to the differential input unit 600 as an inverted input signal according to an example embodiment. Accordingly, the inverted input signal is one of a plurality of input signals supplied to the output buffer 50m. The output buffer 50m may be embodied as a rail-to-rail operational amplifier, for example.

Together, the differential input unit 600 and the gain unit 700 form the above described differential amplification unit. The differential amplification unit may be a folded cascade operational transconductance amplifier (OTA), for example.

According to an example embodiment, the differential amplification unit generates control currents IC12 and IC22 by amplifying the difference between the voltages of an analog image signal IN (input signal) supplied to the output buffer 50m and the signal Am output from the output buffer 50m. The analog image signal may be received from the gamma decoder of the gamma decoder circuit 440 illustrated in FIG. 5, for example.

The differential input unit 600 generates first control currents IC11, IC21, IIC31, and IC41 by amplifying the difference between the voltages of the analog image signal IN and the signal Am output from output buffer 50m.

The differential input unit 600 may include a plurality of first input transistors 605, 608, a plurality of second input transistors 606, 607, a first bias current source 601, a second bias current source 611, a third bias current source 602, a fourth bias current source 612, a first switch 603, a second switch 609, a third switch 604, and a fourth switch 610 as shown in FIG. 6, for example.

Referring to FIG. 6, the first bias current source 601 is connected to a source of boosted voltage AVDD (first voltage) and the second bias current source 611 is connected to a source of ground voltage VSS (second voltage). The first and second bias current sources 601 and 611 supply bias current of the differential input unit 600 during the charge recycling period RP according to an example embodiment.

Still referring to FIG. 6, the third bias current source 602 is connected to the source of boosted voltage AVDD, and the fourth bias current source 612 is connected to the source of ground voltage VSS. The third and fourth bias current sources 602 and 612 supply bias current of the differential input unit 600 during the driving period DP according to an example embodiment.

The amounts of current in the first and second bias current sources 601, 611 are greater than those of current in the third and fourth bias current sources 602 and 612. As illustrated in FIG. 6, the amount of current IB1L in the first bias current source 601 may be equal to the amount of current IB1L in the second bias current source 611, and the amount of current IB1S in the third bias current source 602 may be equal to the amount of current IB1S in the fourth bias current source 612.

The first input transistors 605 and 608 and the second input transistors 606 and 607 may receive the analog image signal IN and the signal Am output from the output buffer 50m, and may generate the first control currents IC11, IC21, IC31, and IC41. The first input transistors 605 and 608 may be PMOS transistors, and the second input transistors 606 and 607 may be NMOS transistors. For example, as shown in FIG. 6, the first input transistor 605 and the second input transistor 606 receive the analog image signal IN, whereas the first input transistor 608 and the second input transistor 607 receive the signal Am output from the output buffer 50m.

The first switch 603 connects the source terminals of the first bias current source 601 to both of the first input transistors 605 and 608 in response to a charge recycling signal CR_ON or disconnects the source terminals of the first bias current source 601 from both of the first input transistors 605 and 608 in response to the charge recycling signal CR_ON. The charge recycling signal CR_ON indicates the charge recycling period RP. The second switch 609 connects the source terminals of the second bias current source 611 to both of the second input transistors 606 and 607 in response to the charge recycling signal CR_ON or disconnects the source terminals of the second bias current source 611 from both of the second input transistors 606 and 607 in response to the charge recycling signal CR_ON.

The third switch 604 connects the source terminals of the third bias current source 602 to both of the first input transistors 605 and 608 in response to a driving signal CR_ONB or disconnects the source terminals of the third bias current source 602 from both of the first input transistors 605 and 608 in response to a driving signal CR_ONB. The driving signal CR_ONB may indicate the driving period DP. The fourth switch 610 connects the source terminals of the fourth bias current source 612 to both of the second input transistors 606 and 607 in response to the driving signal CR_ONB or disconnects the source terminals of the fourth bias current source 612 from both of the second input transistors 606 and 607 in response to the driving signal CR_ONB. The driving signal CR_ONB may be an inverted signal of the charge recycling signal CR_ON, and may be the same as the output control signal GRAY_ON.

Still referring to FIG. 6, the gain unit 700 may add the first control currents IC11, IC21, 11C31, and IC41 together to generate the second control currents IC12 and IC22. In FIG. 6, the gain unit 700 includes a first current mirror circuit 720, a second current mirror circuit 740, a first floating current source 709, a second floating current source 710, a first floating voltage source 712, a second floating voltage source 711, a fifth switch 705, a sixth switch 706, a seventh switch 708, and an eighth switch 707.

The first floating current source 709 may supply bias current of the gain unit 700 to drive one or more of the first current mirror circuit 720, the second current mirror circuit 740, and the first floating voltage source 712 during the charge recycling period RP. The second floating current source 710 may supply bias current of the gain unit 700 to drive one or more of the first current mirror circuit 720, the second current mirror circuit 740, and the second floating voltage source 711 during the driving period DP. According to an example embodiment, first floating current source 709 supplies bias current of the gain unit 700 to drive the first current mirror circuit 720, the second current mirror circuit 740, and the first floating voltage source 712 during the charge recycling period RP. Further, the second floating current source 710 supplies bias current of the gain unit 700 to drive one or more of the first current mirror circuit 720, the second current mirror circuit 740, and the second floating voltage source 711 during the driving period DP. The amount of current IB2L in the first floating current source 709 is greater than that of current IB2L in the second floating current source 710 according to an example embodiment.

In the example embodiment of FIG. 6, the first floating voltage source 712 controls quiescent current IB3S to be generated in the output unit 800 during the charge recycling period RP. The second floating voltage source 711 controls quiescent current IB3L to be generated in the output unit 800 during the driving period DP. The voltage VBL of the first floating voltage source 712 is greater than the voltage VBS of the second floating voltage source 711 according to an example embodiment. Thus, the amount of the quiescent current IB3S generated by the first floating voltage source 712 is less than that of the quiescent current IB3L generated by the second floating voltage source 711.

The first current mirror circuit 720 receives first differential current signals IC11 and IC21 from among the first control currents IC11, IC21, IC31, and IC41 from the differential input unit 600, and is connected to the source of boosted voltage AVDD. The first current mirror circuit 720 may include transistors. For example, the first current mirror circuit 720 shown in FIG. 6 includes PMOS transistors 701, 702, 703, and 704. A bias voltage VB1 may be applied to the gates of the PMOS transistors 703 and 704, for example.

Referring to FIG. 6, the second current mirror circuit 740 shown in FIG. 6 receives second differential current signals IC31, IC41 from among the first control currents IC11, IC21, IC31, and IC41 from the differential input unit 600, and is connected to the source of ground voltage VSS. The second current mirror 740 includes transistors. For example, the second current mirror circuit 740 includes NMOS transistors 713, 714, 715, and 716. The bias voltage VB2 may be applied to the gates of the NMOS transistors 713 and 714.

Together, the first current mirror circuit 720 and the second current mirror circuit 740 form a current summing circuit, and respectively generate the second control currents IC12 and IC22 for driving output unit 800.

The fifth switch 705 connects the first current mirror circuit 720 and the second current mirror circuit 740 via the first floating current source 709 in response to the charge recycling signal CR_ON or disconnects the first current mirror circuit 720 and the second current mirror circuit 740 from each other, via the first floating current source 709, in response to the charge recycling signal CR_ON. The sixth switch 706 connects the first current mirror circuit 720 and the second current mirror circuit 740 in response to the driving signal CR_ONB or disconnects the first current mirror circuit 720 and the second current mirror circuit 740 from each other in response to the driving signal CR_ONB. The second floating current source 710 is connected between the second floating current mirror circuit 740 and the sixth switch 706.

The seventh switch 708 connects the first current mirror circuit 720 and the second current mirror circuit 740 in response to the charge recycling signal CR_ON, or disconnects the first current mirror circuit 720 and the second current mirror circuit 740 in response to the charge recycling signal CR_ON. The first floating voltage source 712 is connected between the seventh switch 708 and the second current mirror circuit 740. The eighth switch 707 connects the first current mirror circuit 720 and the second current mirror circuit 740 in response to the driving signal CR_ONB or disconnects the first current mirror circuit 720 from the first current mirror circuit 740 in response to the driving signal CR_ONB. The second floating voltage source 711 is connected between the eight switch 707 and the second current mirror circuit 740.

According to an example embodiment, the output unit 800 outputs the signal Am obtained by amplifying the analog image signal IN in response to the control currents IC12 and IC22.

Referring to FIG. 6, the output unit 800 includes a PMOS transistor 801, an NMOS transistor 802, and a plurality of compensation capacitors. The source of the PMOS transistor 801 is connected to the source of boosted voltage AVDD, and the source of the NMOS transistor 802 is connected to the source of ground voltage VSS. The compensation capacitors CC1 and CC2 are connected between an output node NO for outputting the amplified analog image signal Am and the gain unit 700. The compensation capacitors CC1 and CC2 are capable of preventing or reducing oscillation of the amplified analog image signal AM.

An example embodiment of the output buffer 50m such as the one shown in FIG. 6 may include the first through fourth bias current sources 601, 611, 602, and 612, the first and second floating current sources 709 and 710, and the first and second floating voltage sources 712 and 711. According to an example embodiment, in the charge recycling period RP, the output buffer 50m increases the amounts of bias currents that respectively drive the differential input unit 600 and the gain unit 700 and reduces the amount of quiescent current flowing through the output unit 800. Also, in the driving period DP, the output buffer 50m reduces the amounts of bias currents that respectively drive the differential input unit 600 and the gain unit 700 and increases the amount of quiescent current flowing through the output unit 800. That is, an example embodiment of an output buffer 50m is capable of reducing the amount of quiescent current in the charge recycling period RP and the amounts of bias currents that drive the differential input unit and the gain unit in the driving period DP, thereby reducing the consumption of power in the output buffer 50m.

Figure 7:
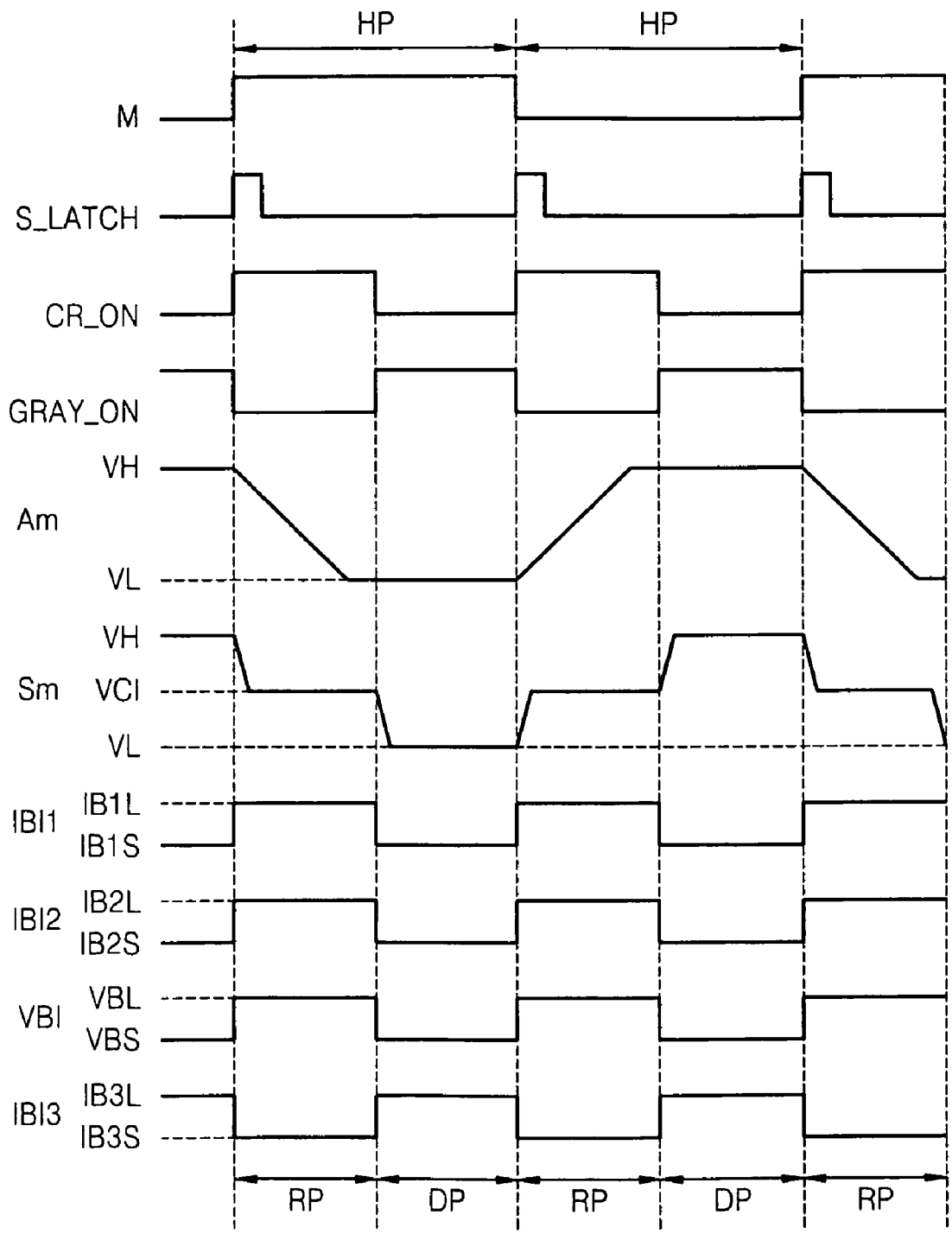
FIG. 7 is a timing diagram illustrating the operation of a source driver illustrated in FIG. 5 according to an embodiment of the present application.

FIG. 7 is a timing diagram illustrating the operation of the source driver illustrated in FIG. 5, according to an embodiment of the present application. The operation of the source driver is described below with reference to FIGS. 5 through 7.

Referring to FIG. 7, an inverted control signal M is toggled in time duration units of horizontal scan periods HP. A latch control signal S_LATCH that is activated to logic high during a portion of the horizontal scan period HP causes an amplified analog image signal Am to be generated by the output buffer 50m. The polarity of the amplified analog image signal Am may or may not be inverted based on the logic state of the inverted control signal M. The amplified analog image signal Am may be data, such as black image data, which swings to the full degree between a high voltage VH and a low voltage VL.

An intermediate voltage VCI is applied to a source line connected to the second switch 470 in a charge recycling period RP in which a charge recycling signal CR_ON is activated to logic high and thus the second switch 470 is short-circuited. Then, a source line driving signal Sm transitions from the high voltage VH to the intermediate voltage VCI or from the low voltage VL to the intermediate voltage VCI. The intermediate voltage VCI is a voltage level between the high voltage VH and the low voltage VL.

The amplified analog image signal Am is supplied to a source line connected to the first switch 460 in a driving period DP in which an output control signal GRAY_ON is activated to logic high and thus the first switch 460 is short-circuited. Then, the source line driving signal Sm transitions from the intermediate voltage VCI to the low voltage VL (image data of a logic "low" level) or from the intermediate voltage VCI to the high voltage VH (image data of a logic "high" level).

In the charge recycling period RP, the amount of bias current IBI1 that drives the differential input unit 600 increases to IB1L and the amount of bias current IB12 that drives the gain unit 700 increases to IB2L. Also, as the voltage VBI of the floating voltage source included in the gain unit 700 increases to VBL, the amount of quiescent current IB13 flowing through the output unit 800 decreased to IB3S.

In the driving period RP, the amount of bias current IBI1 that drives the differential input unit 600 decreases to IB1S, which is less than IB1L, and the amount of bias current IB12 that drives the gain unit 700 decreases to IB2S, which is less than IB2L. Further, as the voltage VBI of a floating voltage source included in the gain unit 700 decreases to VBS, which is less than VBL, the amount of quiescent current IB13 flowing through the output unit 800 increases to IB3L, which is greater than IB3S.

An output buffer included in a source driver of an LCD device and a method of operating the output buffer an according to example embodiments of the present application are capable of individually controlling the amount of internal bias current in a charge recycling period and a driving period, thereby reducing the consumption of power (current). Also, according to example embodiments, the output buffer and the method of operating the same are controlled by a charge recycling signal used in a source driver circuit, and do not use and/or require an additional control signal for controlling the output buffer. Since the source driver of the LCD device according to example embodiments of the present application include the output buffer, the consumption of power in the source driver can be reduced. Accordingly, the source drive can be applied to LCD devices for use in portable devices.

While example embodiments of the present application have been particularly shown with reference to the drawings and described above, it will be understood by those of ordinary skill in the art that various changes in form and details may be made therein without departing from the spirit and scope of the present application.

What is claimed is:
1. An output buffer included in a source driver of a liquid crystal display (LCD) device, the output buffer comprising:
   a differential amplification unit generating control currents by amplifying a difference between voltages of an analog image signal and a signal output from the output buffer; and
   an output unit outputting a signal obtained by amplifying the analog image signal in response to the control currents;
   wherein an amount of bias current for driving the differential amplification unit increases and an amount of quiescent current flowing through the output unit decreases during a charge recycling period in which a source line of the LCD device is precharged to a precharge voltage, and wherein the amount of the bias current for driving the differential amplification unit decreases and the amount of the quiescent current flowing through the output unit increases during a driving period in which the amplified analog image signal is supplied to the source line after the source line is precharged.

2. The output buffer of claim 1, wherein the differential amplification unit is a folded cascade operational transconductance amplifier.

3. The output buffer of claim 1, wherein the precharge voltage is half a maximum gray-level voltage of the analog image signal.

4. The output buffer of claim 1, wherein the differential amplification unit includes:

a differential input unit generating first control currents by amplifying the difference between the voltages of the analog image signal and the signal output from the output buffer; and a gain unit generating second control currents by adding the first control currents together;

wherein the output unit outputs the signal in response to the second control currents generated by the gain unit, wherein during the charge recycling period, the amount of the bias current for driving the differential input unit increases, the amount of bias current for driving the gain unit increases, and the amount of the quiescent current flowing through the output unit decreases, and wherein during the driving period, the amount of the bias current for driving the differential input unit increases, the amount of the bias current for driving the gain unit decreases, and the amount of the quiescent current flowing through the output unit increases.

5. The output buffer of claim 4, wherein the differential input unit includes:

a first bias current source connected to a source of first voltage and providing a first bias current in the differential input unit during the charge recycling period;

a second bias current source connected to a source of second voltage and providing a second bias current in the differential input unit during the charge recycling period;

a third bias current source connected to the source of first voltage and providing a third bias current in the differential input unit during the driving period; and a fourth bias current source connected to the source of second voltage and providing a fourth bias current in the differential input unit during the driving period;

wherein an amount of the first bias current and the second bias current is greater than an amount of the third bias current and the fourth bias current.

6. The output buffer of claim 5, wherein the amount of current in the first bias current source is equal to the amount of current in the second bias current source, and wherein the amount of current in the third bias current source is equal to the amount of current in the fourth bias current source.

7. The output buffer of claim 5, wherein the first voltage is a boosted voltage having a voltage value higher than a supply voltage, and wherein the second voltage is a ground voltage.

8. The output buffer of claim 6, wherein the differential input unit further includes:

first and second input transistors receiving the analog image signal and the signal output from the output buffer, and generating the first control currents;

a first switch, one of connecting the first input transistors to the first bias current source in response to a charge recycling signal indicating the charge recycling period and disconnecting the first input transistors from the first bias current source in response to the charge recycling signal;

a second switch, one of connecting the second input transistors to the second bias current source in response to the charge recycling signal and disconnecting the second input transistors from the second bias current source in response to the charge recycling signal;

a third switch, one of connecting the first input transistors to the third bias current source in response to a driving signal indicating the driving period and disconnecting the first input transistors from the third bias current source in response to the driving signal; and a fourth switch, one of connecting the second input transistors to the fourth bias current source in response to the driving signal and disconnecting the second input transistors from the fourth bias current source in response to the driving signal.

9. The output buffer of claim 8, wherein the driving signal is an inverted signal of the charge recycling signal.

10. The output buffer of claim 4, wherein the gain unit comprises:

a first floating current source providing bias current in the gain unit during the charge recycling period;

a second floating current source providing the bias current in the gain unit during the driving period;

a first floating voltage source controlling the quiescent current flowing through the output unit during the charge recycling period; and a second floating voltage source controlling the quiescent current flowing through the output unit during the driving period;

wherein an amount of current in the first floating current source is greater than an amount of current in the second floating current source, and wherein a voltage of the first floating voltage source is greater than a voltage of the second floating voltage source.

11. The output buffer of claim 10, wherein the gain unit further comprises:

a first current mirror circuit receiving a first differential current signal from among the first control currents, the first current mirror circuit being connected to a source of first voltage;

a second current mirror circuit receiving a second differential current signal from among the first control currents, the second current mirror circuit being connected to a source of second voltage;

a first switch, one of connecting the first current mirror circuit to the second current mirror circuit in response to a charge recycling signal indicating the charge recycling period and disconnecting the first current mirror circuit from the second current mirror circuit in response to the charge recycling signal;

a second switch, one of connecting the first current mirror circuit to the second current mirror circuit in response to a driving signal indicating the driving period and disconnecting the first current mirror circuit from the second current mirror circuit in response to the driving signal;

a third switch, one of connecting the first current mirror circuit to the second current mirror circuit in response to the charge recycling signal and disconnecting the first current mirror circuit from the second current mirror circuit in response to the charge recycling signal; and a fourth switch, one of connecting the first current mirror circuit to the second current mirror circuit in response to the driving signal and disconnecting the first current mirror circuit from the second current mirror circuit in response to the driving signal;

wherein the first floating current source is connected between the first switch and the second current mirror circuit, the second floating current source is connected between the second switch and the second current mirror circuit, the first floating voltage source is connected between the third switch and the second current mirror circuit, and the second floating voltage source is connected between the fourth switch and the second current mirror circuit, wherein the first current mirror circuit and the second current mirror circuit form a current summing circuit, and wherein the first current mirror circuit and the second current mirror circuit generate the second control currents for driving the output unit.

12. The output buffer of claim 11, wherein the first voltage is a boosted voltage having a voltage value higher than a supply voltage, and wherein the second voltage is a ground voltage.

13. The output buffer of claim 11, wherein the driving signal is an inverted signal of the charge recycling signal.

14. The output buffer of claim 4, wherein the output unit includes:

a plurality of compensation capacitors connected between a node for outputting the amplified analog image signal and the gain unit;

wherein the plurality of compensation capacitors reduces oscillation of the amplified analog image signal.

15. An output buffer included in a source driver of a liquid crystal display (LCD) device, the output buffer comprising:

a differential input unit generating first control currents by amplifying a difference between voltages of an analog image signal and a signal output from the output buffer;

a gain unit generating second control currents by adding the first control currents together; and an output unit outputting a signal obtained by amplifying the analog image signal in response to the second control currents;

wherein the differential input unit comprises:

first and second bias current sources having a first amount of current during a charge recycling period in which a source line of the LCD device is precharged to a precharge voltage; and third and fourth bias current sources having a second amount of current during a driving period in which the amplified analog image signal is supplied to the source line after the source line is precharged, the second amount of current being less than the first amount of current;

wherein the gain unit comprises:

a first floating current source which drives the gain unit and has a third amount of current during the charge recycling period;

a second floating current source which drives the gain unit and has a fourth amount of current during the driving period, the fourth amount of current being less than the third amount of current;

a first floating voltage source which controls a first quiescent current to be generated in the output unit and has a first voltage during the charge recycling period; and a second floating voltage source which controls a second quiescent current to be generated in the output unit and has a second voltage during the driving period, the second voltage being less than the first voltage; and wherein an amount of the first quiescent current is less than an amount of the second quiescent current.

16. The output buffer of claim 15, wherein the differential input unit and the gain unit together form a folded cascade operational transconductance amplifier.

17. The output buffer of claim 15, wherein the precharge voltage is half a maximum gray-level voltage of the analog image signal.

18. The output buffer of claim 15, wherein the differential input unit further comprises:

first and second input transistors receiving the analog image signal and the signal output from the output buffer, and generating the first control currents;

a first switch, one of connecting the first input transistors to the first bias current source in response to a charge recycling signal indicating the charge recycling period and disconnecting the first input transistors from the first bias current source in response to the charge recycling signal;

a second switch, one of connecting the second input transistors to the second bias current source in response to the charge recycling signal and disconnecting the second input transistors from the second bias current source in response to the charge recycling signal;

a third switch connecting the first input transistors to the third bias current source in response to a driving signal indicating the driving period and disconnecting the first input transistors from the third bias current source in response to the driving signal; and a fourth switch connecting the second input transistors to the fourth bias current source in response to the driving signal and disconnecting the second input transistors from the fourth bias current source in response to the driving signal.

19. The output buffer of claim 18, wherein the driving signal is an inverted signal of the charge recycling signal.

20. The output buffer of claim 15, wherein the gain unit further comprises:

a first current mirror circuit receiving a first differential current signal from among the first control currents, the first current mirror circuit being connected to a source of a boosted voltage higher than a supply voltage;

a second current mirror circuit receiving a second differential current signal from among the first control currents, the second current mirror circuit being connected to a source of a ground voltage;

a first switch, one of connecting the first current mirror circuit to the second current mirror circuit in response to a charge recycling signal indicating the charge recycling period and disconnecting the first current mirror circuit from the second current mirror circuit in response to the charge recycling signal;

a second switch, one of connecting the first current mirror circuit to the second current mirror circuit in response to a driving signal indicating the driving period and disconnecting the first current mirror circuit from the second current mirror circuit in response to the driving signal;

a third switch, one of connecting the first current mirror circuit to the second current mirror circuit in response to the charge recycling signal and disconnecting the first current mirror circuit from the second current mirror circuit in response to the charge recycling signal; and a fourth switch, one connecting the first current mirror circuit to the second current mirror circuit in response to the driving signal and disconnecting the first current mirror circuit from the second current mirror circuit in response to the driving signal;

wherein the first floating current source is connected between the first switch and the second current mirror circuit, the second floating current source is connected between the second switch and the second current mirror circuit, the first floating voltage source is connected between the third switch and the second current mirror circuit, and the second floating voltage source is connected between the fourth switch and the second current mirror circuit, wherein the first current mirror circuit and the second current mirror circuit form a current summing circuit, and wherein the first current mirror circuit and the second current mirror circuit generate the second control currents for driving the output unit.

21. The output buffer of claim 20, wherein the driving signal is an inverted signal of the charge recycling signal.

22. The output buffer of claim 15, wherein the output unit comprises:
   a plurality of compensation capacitors which are connected between a node for outputting the amplified analog image signal and the gain unit;
   wherein the plurality of compensation capacitors reduce oscillation of the amplified analog image signal.

23. A method of operating an output buffer included in a source driver of a liquid crystal display (LCD) device, the method comprising:
   generating control currents by amplifying a difference between voltages of an analog image signal and a signal output from the output buffer;
   outputting a signal obtained by amplifying the analog image signal in response to the control currents;
   increasing an amount of bias current for driving a differential amplification unit included in the output buffer and reducing an amount of quiescent current flowing through an output unit included in the output buffer during a charge recycling period in which a source line of the LCD device is precharged to a precharge voltage; and
   reducing the amount of the bias current for driving the differential amplification unit and increasing the amount of the quiescent current flowing through the output unit included in the output buffer during a driving period in which the amplified analog image signal is supplied to the source line after the source line is precharged.

24. The method of claim 23, wherein the precharge voltage is half a maximum gray-level voltage of the analog image signal.

25. The method of claim 23, wherein generating the control currents:
   generates first control currents by amplifying the difference between the voltages of the analog image signal and the signal output from the output buffer; and
   obtains second control currents by summing the first control currents;
   wherein outputting the signal outputs the signal in response to the second control currents,
   wherein increasing the amount of bias current for driving the differential amplification unit increases an amount of bias currents that respectively drive a differential input unit and a gain unit included in the differential amplification unit and reduces the amount of quiescent current flowing through the output unit included in the output buffer during the charge recycling period, and
   wherein reducing the amount of the bias current for driving the differential amplification unit reduces the amount of bias currents that respectively drive the differential input unit and the gain unit and increases the amount of the quiescent current flowing through the output unit included in the output buffer during the driving period.

26. The method of claim 25, wherein the precharge voltage is half a maximum gray-level voltage of the analog image signal.

27. A source driver of a liquid crystal display (LCD) device, the source driver comprising:
   a gamma decoder transforming a digital image signal into an analog image signal and outputting the analog image signal; and
   an output unit of an output buffer amplifying and outputting the analog image signal;
   wherein an amount of bias current for driving a differential amplification unit of the output buffer increases and an amount of quiescent current flowing through the output unit of the output buffer decreases during a charge recycling period in which a source line of the LCD device is precharged to a precharge voltage, and
   wherein the amount of the bias current for driving the differential amplification unit decreases and the amount of the quiescent current flowing through the output unit of the output buffer increases during a driving period in which the amplified analog image signal is supplied to the source line after the source line is precharged.

28. The source driver of claim 27, wherein the precharge voltage is half a maximum gray-level voltage of the analog image signal.

* * * * *